United States Patent

Jordan

[15] 3,699,362

[45] Oct. 17, 1972

[54] TRANSISTOR LOGIC CIRCUIT

[72] Inventor: Paul V. Jordan, Beacon, N.Y.

[73] Assignee: International Business Machines Corporation, Armonk, N.Y.

[22] Filed: May 27, 1971

[21] Appl. No.: 147,568

[52] U.S. Cl. ....................307/300, 307/215, 307/299

[51] Int. Cl. ............................................H03k 19/34

[58] Field of Search.......................307/300, 215, 299

[56] References Cited

UNITED STATES PATENTS

| | | | |
|---|---|---|---|
| 3,555,294 | 1/1971 | Treadway | 307/215 |
| 3,522,444 | 8/1970 | Lourie | 307/299 |
| 3,144,563 | 8/1964 | Cohler et al | 307/300 |
| 3,614,467 | 10/1971 | Tu | 307/215 |
| 3,089,041 | 5/1963 | Bonsel | 307/299 |
| 3,495,141 | 2/1970 | Dahlberg | 307/299 |

OTHER PUBLICATIONS

" Power Tetrode Application Data" (cover sheet) Nov. 17, 1960 Honeywell Semiconductor Products

*Primary Examiner*—James W. Lawrence
*Assistant Examiner*—Harold A. Dixon
*Attorney*—Hanifin and Jancin and Wolmar J. Stoffel

[57] ABSTRACT

A transistor-transistor logic circuit employing a Schottky barrier diode connected across the output of the multi-emitter input transistor and the reference potential to suppress transient overshoot by controlling the voltage at the collector of the input transistor of the TTL circuit.

4 Claims, 3 Drawing Figures

INVENTOR
PAUL V. JORDAN

BY Wolmar J. Stoffel
ATTORNEY

TRANSISTOR LOGIC CIRCUIT

BACKGROUND OF THE INVENTION

This invention relates to logic circuits. More particularly it is concerned with high speed digital transistor-transistor logic circuits designed with a high internal impedance to decrease power requirements.

Digital logic circuits are widely used for performing logic operations in computers and data processing equipment. Circuits employing semiconductor diodes have been designed and produced to provide the various necessary digital logic functions. With advances in the art of monolithic integrated circuit networks, and entire logic circuit, or numbers of such circuits may be fabricated within a single piece of semiconductor material.

Various types of digital logic circuits have been developed for fabrication as integrated circuits. In particular the transistor-transistor type logic (TTL) has become widely accepted because of the availability of certain circuits having favorable switching speeds, power dissipation, immunity to noise, the relatively large number of succeeding logic circuits which can be operated with parallel input connections to the output connection of a given logic circuit, and the capacitive load driving capability.

A primary consideration in the design and function of logic circuits is the attainment of high switching speeds. The term "speed" normally implies that rate at which the output changes from one state or another, i.e., the slope of the transition of the output, the delay in propagating a changed logic level through the circuit, and the rate at which the circuit can be cycled between states, i.e., the repetition rate. As a general principle the speed of operation of any particular logic circuit configuration can be increased by increasing the power applied to the circuit. However, in general an increase in power is accompanied by an increase in the amount of heat which must be dissipated. The general approach in decreasing the power requirements of transistor-transistor logic circuits has been to increase the resistance of the overall circuit. In many applications, such as logic circuits, particularly those used in the voltage mode, transmission line connections to the circuit are essentially unterminated due to the high built-in internal impedance. In operation two deleterious effects can occur. Since the the unused inputs of the multiple emitter transistor of a TTL circuit are transiently tied to a relatively very negative input voltage, the reverse biased junctions can breakdown. The undershoot pulse will be followed by an overshoot when the reflection comes back through the transmission line from the driver circuit. This leaves open the possibility of false switching of the logic circuit particularly when the length of the transmission lines interconnecting the TTL circuits are long in comparison to the circuit transition times. This is a common problem when interconnecting circuits in different packages when the circuits have been designed to achieve optimum performance. The various major types of self-generated noise, particularly reflected noise created by discontinuities in signal lines and end of line termination mismatches in TTL circuits is explained in detail in an article entitled "An Approach to Logic Circuit Noise Problems in Computer Designs," April 1969, pages 84 through 91, and in second article entitled "Is TTL Really Superior to DTL" which appears in Electronic Engineering, September 1970. In the past the problem has been solved by adding diodes to each input emitter, which can be either Schottky diodes or regular diodes. An application of this solution is illustrated in the circuit diagram shown on page 5 in "TTL Integrated Circuits Catalog" from Texas Instruments catalog number CC 201–R dated August 1969. However, such a solution adds materially to the cost of the circuit since a diode is needed for each of the emitters of the multiple emitter transistor and the diodes must be insulated from each other. This requires a separate insulating area for each diode. Further, a significant capacitance is contributed by each of the junctions. The circuit improvement of this invention minimizes self-generated reflected noise in TTL circuits created by mismatch between the transmission lines and circuit terminations for that line by the addition of a a single element that can be easily and conveniently fabricated in an integrated circuit device.

SUMMARY OF THE INVENTION

An object of this invention is to provide an improved transistor-transistor logic circuit.

Another object of this invention is to provide an improved TTL circuit having a high internal resistance and capable of operating on relatively large voltage input signals received through relatively long transmission lines.

Yet another object of this invention is to provide a TTL circuit adapted to minimize internal overshoot problems within the circuit by controlling voltage at the collector of the input transistor of the TTL circuit.

These and other objects and advantages are provided in a logic circuit having a multi-emitter transistor for receiving input logic signals and responding by operating either in a first condition or a second condition, an output transistor for providing an output logic signal, connecting the collector of the input multi-emitter transistor to the output transistor and operable to bias the output transistor to a substantially non-conducting condition when the input transistor is in the first operating condition, and to a conducting condition when the input transistor is in a second operating condition, the improvement being a unidirectional voltage control means connected to the collector of the input transistor and a reference potential which operates to eliminate signal fluctuations from the collector of the input transistor when in a first operating condition. More preferably the current voltage means is a Schottky Barrier Diode.

BRIEF DESCRIPTION OF THE DRAWING

The foregoing and other objects, features, and advantages of the invention will be apparent from the following more particular description of the preferred embodiments of the invention as illustrated in the accompanying drawings wherein.

DESCRIPTION OF PERFERRED EMBODIMENTS

Figure 1:
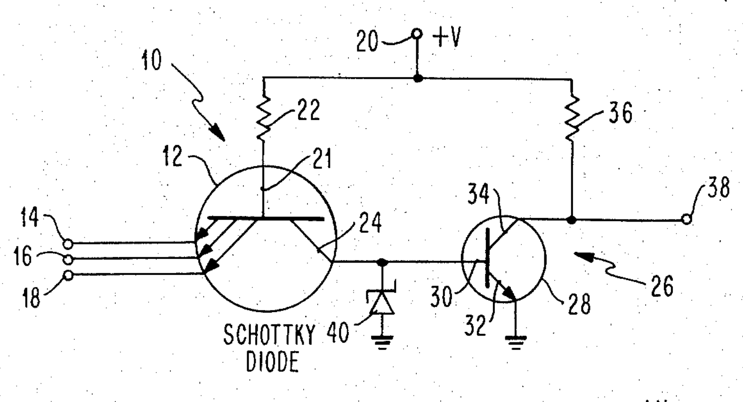
FIG. 1 is a schematic circuit diagram of a TTL gate circuit constructed in accordance with the present invention.

Referring now to the drawings and to FIG. 1 in particular, TTL gate circuit 10 has a multiple emitter transistor 12 provided with input terminals 14, 16, and 18, a voltage source 20 connected to the base 21 through resistor 22, and a collector 24. An output means 26 has a transistor 28 with the base 30 connected to collector 34, an emitter 32 connected to ground potential, and a collector 34 connected to voltage source 20 through resistor 36. Output terminal 38 is connected to the collector 34 of transistor 28. The structure described thus far is a basic structure of the TTL gate well known to the art. The improvement set forth in this application is the provision of a Schottky Barrier Diode 40 connected across the collector 24 of transistor 12 and ground or some other referenced potential.

Figures 2, 3:
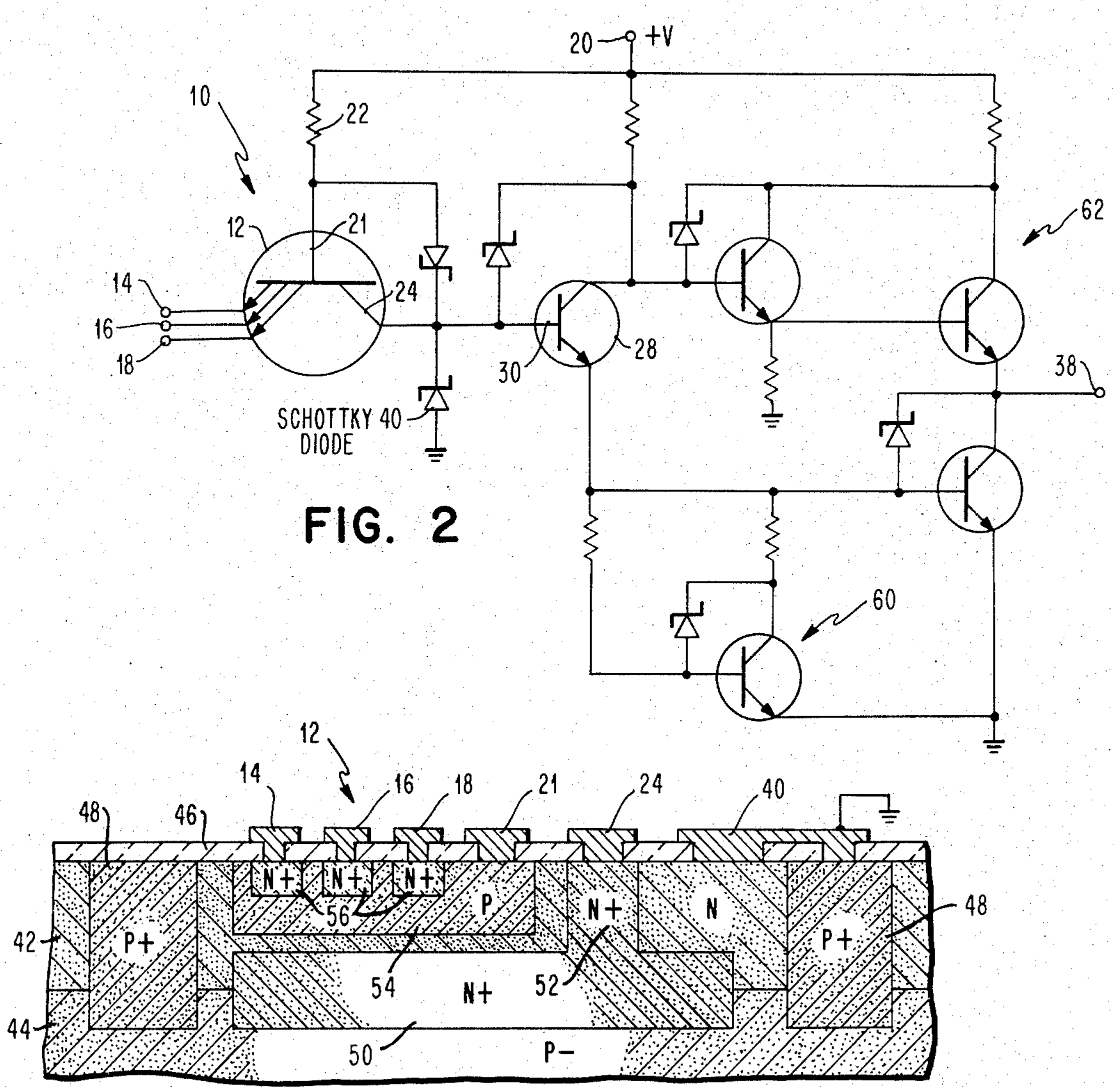
FIG. 2 is a schematic circuit diagram of another preferred specific embodiment of a TTL gate circuit constructed in accordance with the present invention.
FIG. 3 is an elevational view in broken section of a multiple emitter transistor suitable for use in a TTL gate made in accordance with the present invention.

Diode 40 could alternatively be a conventional diode. Diode 40 is a unidirectional voltage control means which is an alternative to the prior art solution of providing diodes to each input emitter, 14, 16, and 18, in order to minimize fluctuations which appear in the collector that might result from breakdown of the reversed biased emitters in the input when one or more of the inputs receive a positive input current pulse. When a diode 40 is provided as shown in FIG. 1 only a single diode is required. Further, since it is connected directly to the collector region of the multiple emitter transistor 12, a Schottky Barrier Diode will not require separate insulating means, as would be the case if separate diodes were connected to each of the inputs of the emitter. In FIG. 3 there is illustrated an arrangement for fabricating multi-emitter transistor 12 and Schottky Barrier 40. There is shown an N type epitaxial layer 42 supported on base 44 covered by an overlying layer of silicon dioxide 46. Isolation diffusions 48 insulate device 12 and diode 40 from adjacent elements on the integrated circuit device. Collector 24 includes a subcollector region 50 and a reach-through diffusion 52. Within base region 54 are provided N+ diffusions 56 which constitute the emitters 14, 16, and 18 of the device 12. Making contact with the N type collector is a Schottky Barrier 40. In use the contact would be connected to ground potential which could be obtained with a conductor connected across diode 40 and making contact with isolation diffusion 48. Referring now to FIG. 2 there is illustrated another type of TTL circuit which can be modified by including a unidirectional voltage control means connected to the emitter terminal of the input means. As shown, the circuit includes a transistor 12 having a multiple emitter structure 14, 16, and 18, a collector 24, and a base 21 biased by voltage source 20 through resistor 22. The output from collector 24 is connected to the base 30 of output transistor 28. As is believed clearly shown in FIG. 2 the output means can be modified to include a separate circuit configuration 60 to sharpen up the voltage characteristic of the output pulse, and a push-pull output circuit means 62 which provides a low impedance to drive the output. As in FIG. 1, a constant voltage source 40 is provided which is connected across the collector 24 and a reference potential, commonly ground. Various modifications can be made in the circuit as for example, providing a Schottky Diode which connects the collector and base of the transistors.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a logic circuit having a multi-emitter transistor input means for receiving input logic signals and responding by operating in either a first condition or a second condition, an output transistor means for providing an output logic signal, means connecting the collector of the input transistor means to the output transistor means and operable to bias the output transistor to a substantially non-conducting condition when the input transistor means is in a first operating condition and to a conducting condition when the input transistor means is in a second operating condition, the improvement comprising;
   a Schottky barrier diode connected to the collector of said input transistor means and a reference potential which operates to eliminate signal fluctuations from the collector of said input transistor means when in a first operating condition by controlling the voltage at the collector of the said input transistor.

2. The logic circuit of claim 1 wherein said multi-emitter transistor input means is a NPN transistor the cathode of said Schottky barrier diode connected to the collector of the said input transistor means and the anode connected to the reference potential,
   said reference potential being more negative than the emitter of said transistor.

3. The logic circuit of claim 1 embodied in an integrated semiconductor circuit device having the input transistor with a collector region extending to the top surface of the device, said Schottky diode comprising;
   a barrier layer located on the top surface of said collector region,
   a metallurgy stripe in electrical contact with said barrier layer and a region maintained at the reference potential.

4. The logic circuit of claim 3 wherein said region maintained at a reference potential is a diffused region of an impurity opposite the impurity in said collector region that encircles said input transistor.

* * * * *